(12) United States Patent
Holder et al.

(10) Patent No.: US 9,482,394 B2
(45) Date of Patent: *Nov. 1, 2016

(54) LED DEVICE FOR WIDE BEAM GENERATION AND METHOD OF MAKING THE SAME

(71) Applicant: Illumination Management Solutions, Inc., Irvine, CA (US)

(72) Inventors: Ronald G. Holder, Laguna Niguel, CA (US); Greg Rhoads, Irvine, CA (US)

(73) Assignee: ILLUMINATION MANAGEMENT SOLUTIONS, INC., Irvine, CA (US)

( * ) Notice: Subject to any disclaimer, the term of this patent is extended or adjusted under 35 U.S.C. 154(b) by 163 days.

This patent is subject to a terminal disclaimer.

(21) Appl. No.: 14/330,598

(22) Filed: Jul. 14, 2014

(65) Prior Publication Data

US 2014/0321116 A1 Oct. 30, 2014

Related U.S. Application Data

(63) Continuation of application No. 13/683,594, filed on Nov. 21, 2012, now Pat. No. 8,777,457, which is a continuation of application No. 12/599,500, filed as application No. PCT/US2008/064168 on May 19, 2008, now Pat. No. 8,430,538.

(60) Provisional application No. 60/939,275, filed on May 21, 2007.

(51) Int. Cl.
*F21V 5/00* (2015.01)
*F21K 99/00* (2016.01)
(Continued)

(52) U.S. Cl.
CPC . *F21K 9/50* (2013.01); *F21K 9/00* (2013.01); *F21V 5/00* (2013.01); *F21V 5/04* (2013.01);
(Continued)

(58) Field of Classification Search
CPC .............. F21V 5/00; F21V 5/04; F21V 5/08; F21Y 2101/02; G02B 19/0014; G02B 19/0028; G02B 19/0061; G02B 19/0071; H01L 33/58
USPC ........................................................ 362/326
See application file for complete search history.

(56) References Cited

U.S. PATENT DOCUMENTS 2,254,961 A 9/1941 Harris
2,394,992 A 2/1946 Franck
(Continued)

FOREIGN PATENT DOCUMENTS

CN 2750186 1/2006
CN 1737418 2/2006
(Continued)

OTHER PUBLICATIONS

Streetworks fixture from Cooper Lighting and 2 IES files, Aug. 14, 2001.
(Continued)

*Primary Examiner* — Ali Alavi
(74) *Attorney, Agent, or Firm* — King & Spalding LLP

(57) ABSTRACT

A predetermined illuminated surface pattern is generated from a predetermined energy distribution pattern of an LED light source within an LED package having a light transmitting dome. An estimated optical transfer function of a lens shape of an optic is defined by the shape of an exterior and inner surface which envelopes at least in part the light transmitting dome of the LED package. An energy distribution pattern is obtained by combination of the estimated optical transfer function and the predetermined energy distribution pattern of the light source. A projection of the energy distribution pattern onto the illuminated surface is determined. The projection is compared to the predetermined illuminated surface pattern. The estimated optical transfer function is illuminated surface pattern.

20 Claims, 1 Drawing Sheet

(51) Int. Cl.
*F21V 5/04* (2006.01)
*G02B 27/09* (2006.01)
*G02B 19/00* (2006.01)
*F21W 131/103* (2006.01)
*F21Y 101/02* (2006.01)
*H01L 33/58* (2010.01)

(52) U.S. Cl.
CPC ....... *G02B 19/0014* (2013.01); *G02B 19/0061* (2013.01); *G02B 27/0955* (2013.01); *F21W 2131/103* (2013.01); *F21Y 2101/02* (2013.01); *H01L 33/58* (2013.01)

(56) References Cited

U.S. PATENT DOCUMENTS

| | | |
|---|---|---|
| 2,908,197 A | 10/1959 | Wells et al. |
| 3,596,136 A | 7/1971 | Fischer |
| 3,647,148 A | 3/1972 | Wince |
| 3,927,290 A | 12/1975 | Denley |
| 4,345,308 A | 8/1982 | Mouyard et al. |
| 4,460,945 A * | 7/1984 | Chan ............... F21V 15/00 362/255 |
| 4,729,076 A | 3/1988 | Masami |
| 4,734,836 A | 3/1988 | Negishi |
| 4,860,177 A | 8/1989 | Simms |
| 4,907,044 A | 3/1990 | Schellhorn et al. |
| 4,941,072 A | 7/1990 | Yasumoto |
| 5,636,057 A | 6/1997 | Dick et al. |
| 5,782,555 A | 7/1998 | Hochstein |
| 5,857,767 A | 1/1999 | Hochstein |
| 5,924,788 A | 7/1999 | Parkyn, Jr. |
| 5,939,996 A | 8/1999 | Kniveton et al. |
| 6,045,240 A | 4/2000 | Hochstein |
| 6,050,707 A | 4/2000 | Kondo et al. |
| 6,102,558 A | 8/2000 | Farnoux |
| 6,227,684 B1 | 5/2001 | Wijbenga |
| 6,227,685 B1 | 5/2001 | McDermott |
| 6,273,596 B1 | 8/2001 | Parkyn, Jr. |
| 6,341,466 B1 | 1/2002 | Kehoe et al. |
| 6,345,800 B1 | 2/2002 | Herst et al. |
| 6,441,558 B1 | 8/2002 | Muthu et al. |
| 6,461,008 B1 | 10/2002 | Pederson |
| 6,502,956 B1 | 1/2003 | Wu |
| 6,527,422 B1 | 3/2003 | Hutchison |
| 6,536,923 B1 | 3/2003 | Merz |
| 6,560,038 B1 | 5/2003 | Parkyn et al. |
| 6,582,103 B1 | 6/2003 | Popovich et al. |
| 6,598,998 B2 | 7/2003 | West et al. |
| 6,639,733 B2 | 10/2003 | Minano |
| 6,784,357 B1 | 8/2004 | Wang |
| 6,785,053 B2 | 8/2004 | Savage, Jr. |
| 6,837,605 B2 | 1/2005 | Reill |
| 6,850,001 B2 | 2/2005 | Takekuma |
| 6,895,334 B2 | 5/2005 | Yabe |
| 6,942,361 B1 | 9/2005 | Kishimura et al. |
| 6,948,838 B2 | 9/2005 | Kunstler |
| 6,965,715 B2 | 11/2005 | Lei |
| 6,997,580 B2 | 2/2006 | Wong |
| 7,070,310 B2 | 7/2006 | Pond et al. |
| 7,073,931 B2 | 7/2006 | Ishida |
| 7,090,370 B2 | 8/2006 | Clark |
| 7,102,172 B2 | 9/2006 | Lynch et al. |
| 7,104,672 B2 | 9/2006 | Zhang |
| 7,153,015 B2 | 12/2006 | Brukilacchio |
| 7,172,319 B2 | 2/2007 | Holder |
| 7,181,378 B2 | 2/2007 | Benitez |
| 7,204,627 B2 | 4/2007 | Ishida |
| 7,237,936 B1 | 7/2007 | Gibson |
| 7,278,761 B2 | 10/2007 | Kuan |
| 7,281,820 B2 | 10/2007 | Bayat et al. |
| 7,322,718 B2 | 1/2008 | Setomoto et al. |
| D563,036 S | 2/2008 | Miyairi et al. |
| 7,329,029 B2 | 2/2008 | Chaves et al. |
| 7,329,030 B1 | 2/2008 | Wang |
| 7,329,033 B2 | 2/2008 | Glovatsky |
| 7,339,200 B2 * | 3/2008 | Amano ............... F21S 48/1145 257/98 |
| 7,347,599 B2 | 3/2008 | Minano et al. |
| 7,348,604 B2 | 3/2008 | Matheson |
| 7,348,723 B2 * | 3/2008 | Yamaguchi ............ G02B 3/04 257/E33.073 |
| 7,352,011 B2 * | 4/2008 | Smits ................. H01L 33/54 257/100 |
| 7,374,322 B2 | 5/2008 | Steen et al. |
| 7,410,275 B2 | 8/2008 | Sommers et al. |
| D577,852 S | 9/2008 | Miyairi et al. |
| 7,460,985 B2 | 12/2008 | Benitez |
| 7,461,948 B2 | 12/2008 | Van Voorst Vader et al. |
| 7,507,001 B2 | 3/2009 | Kit |
| 7,513,639 B2 | 4/2009 | Wang |
| 7,569,802 B1 | 8/2009 | Mullins |
| 7,572,027 B2 | 8/2009 | Zampini, II |
| 7,572,654 B2 | 8/2009 | Chang |
| 7,575,354 B2 | 8/2009 | Woodward |
| 7,582,913 B2 | 9/2009 | Huang et al. |
| 7,618,162 B1 | 11/2009 | Parkyn et al. |
| 7,618,163 B2 | 11/2009 | Wilcox |
| 7,625,102 B2 | 12/2009 | Koike et al. |
| 7,637,633 B2 | 12/2009 | Wong |
| 7,651,240 B2 | 1/2010 | Bayat et al. |
| 7,674,018 B2 | 3/2010 | Holder et al. |
| 7,748,872 B2 | 7/2010 | Holder et al. |
| 7,775,679 B2 | 8/2010 | Thrailkill et al. |
| 7,777,405 B2 | 8/2010 | Steen et al. |
| 7,809,237 B2 | 10/2010 | Pozdnyakov et al. |
| 7,841,750 B2 | 11/2010 | Wilcox et al. |
| 7,942,559 B2 | 5/2011 | Holder |
| 7,972,035 B2 | 7/2011 | Boyer |
| 7,972,036 B1 | 7/2011 | Schach et al. |
| 7,993,036 B2 | 8/2011 | Holder et al. |
| 8,007,140 B2 | 8/2011 | Zhang et al. |
| 8,025,428 B2 | 9/2011 | Duguay et al. |
| 8,210,722 B2 | 7/2012 | Holder et al. |
| 2002/0034081 A1 | 3/2002 | Serizawa |
| 2002/0196623 A1 | 12/2002 | Yen |
| 2003/0067787 A1 | 4/2003 | Serizawa |
| 2003/0099115 A1 | 5/2003 | Reill |
| 2004/0037076 A1 | 2/2004 | Katoh et al. |
| 2004/0070855 A1 | 4/2004 | Benitez et al. |
| 2004/0105171 A1 | 6/2004 | Minano et al. |
| 2004/0105261 A1 | 6/2004 | Ducharme |
| 2004/0105264 A1 | 6/2004 | Spero |
| 2004/0189933 A1 | 9/2004 | Sun et al. |
| 2004/0207999 A1 | 10/2004 | Suehiro |
| 2004/0218388 A1 | 11/2004 | Suzuki |
| 2004/0222947 A1 | 11/2004 | Newton et al. |
| 2004/0228127 A1 | 11/2004 | Squicciarini |
| 2005/0073849 A1 | 4/2005 | Rhoads et al. |
| 2005/0207165 A1 | 9/2005 | Shimizu et al. |
| 2006/0034082 A1 | 2/2006 | Park |
| 2006/0039143 A1 | 2/2006 | Katoh |
| 2006/0081863 A1 | 4/2006 | Kim et al. |
| 2006/0083003 A1 | 4/2006 | Kim et al. |
| 2006/0138437 A1 | 6/2006 | Huang et al. |
| 2006/0238884 A1 | 10/2006 | Jang |
| 2006/0245083 A1 | 11/2006 | Chou et al. |
| 2006/0250803 A1 | 11/2006 | Chen |
| 2006/0255353 A1 | 11/2006 | Taskar |
| 2006/0285311 A1 | 12/2006 | Chang et al. |
| 2007/0019415 A1 | 1/2007 | Leblanc |
| 2007/0019416 A1 | 1/2007 | Han |
| 2007/0058369 A1 | 3/2007 | Parkyn et al. |
| 2007/0063210 A1 | 3/2007 | Chiu |
| 2007/0066310 A1 | 3/2007 | Haar |
| 2007/0076414 A1 | 4/2007 | Holder |
| 2007/0081338 A1 | 4/2007 | Kuan |
| 2007/0081340 A1 | 4/2007 | Chung et al. |
| 2007/0091615 A1 | 4/2007 | Hsieh et al. |
| 2007/0183736 A1 | 8/2007 | Pozdnyakov |
| 2007/0201225 A1 * | 8/2007 | Holder ................. F21K 9/00 362/227 |
| 2007/0258214 A1 | 11/2007 | Shen |
| 2008/0013322 A1 | 1/2008 | Ohkawa |

(56) References Cited

U.S. PATENT DOCUMENTS

| | | |
|---|---|---|
| 2008/0019129 A1 | 1/2008 | Wang |
| 2008/0025044 A1 | 1/2008 | Park et al. |
| 2008/0043473 A1 | 2/2008 | Matsui |
| 2008/0055908 A1 | 3/2008 | Wu |
| 2008/0068799 A1* | 3/2008 | Chan .................. F21V 29/004 361/697 |
| 2008/0080188 A1 | 4/2008 | Wang |
| 2008/0100773 A1 | 5/2008 | Hwang |
| 2008/0174996 A1 | 7/2008 | Lu |
| 2008/0239722 A1 | 10/2008 | Wilcox |
| 2008/0273327 A1 | 11/2008 | Wilcox et al. |
| 2009/0244895 A1 | 10/2009 | Chen |
| 2009/0262543 A1 | 10/2009 | Ho |
| 2010/0014290 A1 | 1/2010 | Wilcox |

FOREIGN PATENT DOCUMENTS

| | | |
|---|---|---|
| DE | 202006015981 | 1/2007 |
| EP | 1431653 | 6/2004 |
| GB | 718425 | 11/1954 |
| GB | 794670 | 5/1958 |
| GB | 815609 | 7/1959 |
| JP | 06-177424 | 6/1994 |
| JP | 11/154766 | 9/1997 |
| JP | 2001-517855 | 9/1998 |
| JP | 2005-062461 | 3/2005 |
| KR | 10-2006-0033572 | 4/2006 |
| KR | 10-2006-0071033 | 6/2006 |
| WO | WO 9624802 | 8/1996 |
| WO | WO 98/33007 | 7/1998 |
| WO | WO 03044870 | 5/2003 |
| WO | WO 2004/068909 | 8/2004 |
| WO | WO 2005/041254 | 5/2005 |
| WO | WO 2005/057082 | 6/2005 |
| WO | WO 2005/093316 | 10/2005 |
| WO | WO 2007/100837 | 9/2007 |
| WO | WO 2008/144672 | 11/2008 |
| WO | WO 2010/019810 | 2/2010 |
| WO | WO 2011/098515 | 8/2011 |

OTHER PUBLICATIONS

Bisberg, *LED Magazine*, The 5mm. Package Versus the Power LED: Not a Light choice for the Luminaire Designer, pp. 19-21, Dec. 2005.
*LED Magazine*, p. 36 Oct. 2005.
International Search Report and Written Opinion for WO 2010/019810 mailed Sep. 30, 2009.
International Search Report and Written Opinion for WO 2008/144672 mailed Nov. 27, 2008.
ISR and Written Opinion of ISA, PCT/US07/05118 mailed Mar. 11, 2008.
Bortz, "Optimal Design of a Non imaging Projection Lens for Use with an LED Light Source and a Rectangular Sheet." SPIE, pp. 130-138, vol. 4092, USA, published 2000.
International Search Report for PCT/US08/64168 mailed on Aug. 15, 2008.
Extended Search Report for EP Application No. 11006191 mailed Nov. 7, 2011.
Extended Search Report for EP Application No. 11006189 mailed Nov. 7, 2011.
Extended Search Report for EP Application No. 11006190 mailed Nov. 7, 2011.
Ries, Harold & Julius Muschaweck, *Tailored Freeform Optical Surfaces*, Optical Society of America, vol. 19, No. 3, Mar. 2002.
Extended Search Report for EP Application No. 08755907.6 mailed May 10, 2012.
Jolley L.B.W. et al., The Therory and Design of Illuminating Engineering Equipment, 1931.
Order; Case No. 11-CV-34-JPS; United States District Court Eastern District of Wisconsin; Jun. 8, 2012; (referencing U.S. Pat. Nos. 7,674,018 and 7,993,036).
International Search Report for PCT/US11/049388 mailed on Apr. 9, 2012.
Timinger, Andreas, Strategies Unlimited, "Charting New Directions in High-Brightness LED's ," Strategies in Light, Feb. 5-7, 2005.
Timinger, Andreas, "Optical Design for LED-Street Lamps," Conference Paper, Solid-State and Organic Lighting (SOLED), Karlsruhe, Germany, Jun. 21, 2010.
Order, Case No. 11-CV-34-JPS; United States District Court Eastern District of Wisconsin; filed Oct. 31, 2012.
LED's Magazine; High-Power LED's; multi-watt LED light Engines Offer Challenges and Opportunities; ledmagazine.com Oct. 2005.
Timinger, "Tailored Optical Surfaces Step up Illumination Design," Europhonics; Aug./Sep. 2002 (color copy).
Plantiff Illumination Management Solutions, Inc.'s Initial Claim Construction Brief; Case No. 2:11-cv-00034 JPS; Apr. 5, 2012.
Ruud Lighting's Notice Pursuant to 35 U.S.C. §282; Civil Action 2:11-cv-00034-JPS; Oct. 12, 2012.
Aoyama, Y.; Yachi, T., "An LED Module Array System Designed for Streetlight Use," Energy 2030 Conference, 2008. ENERGY 2008. IEEE , vol., No., pp. 1-5, Nov. 17-18, 2008, doi: 10.1109/ENERGY.2008.4780996; URL: http://ieeexplore.ieee.org/stamp/stamp.jsp?tp=&arnumber=4780996&isnumber=4780986.
Petroski, J.; Norley, J.; Schober, J.; Reis, B.; Reynolds, R.A.; , "Conduction cooling of large LED array systems," Thermal and Thermomechanical Phenomena in Electronic Systems (ITherm), 2010 12th IEEE Intersociety Conference on , vol., No., pp. 1-10, Jun. 2-5, 2010; doi: 10.1109/ITHERM.2010.5501350; URL: http://ieeexplore.ieee.org/stamp/stamp.jsp?tp=&arnumber=5501350&isnumber=5501251.
Wankhede, M.; Khaire, V.; Goswami, A.; Mahajan, S.D.; , "Evaluation of Cooling Solutions for Out-door Electronics," Electronics Packaging Technology Conference, 2007. EPTC 2007. 9th , vol., No., pp. 858-863, Dec. 10-12, 2007; doi: 10.1109/EPTC.2007.4469682; URL: http://ieeexplore.ieee.org/stamp/stamp.jsp?tp=&arnurnber=4469682&isnumber=4469670.

* cited by examiner

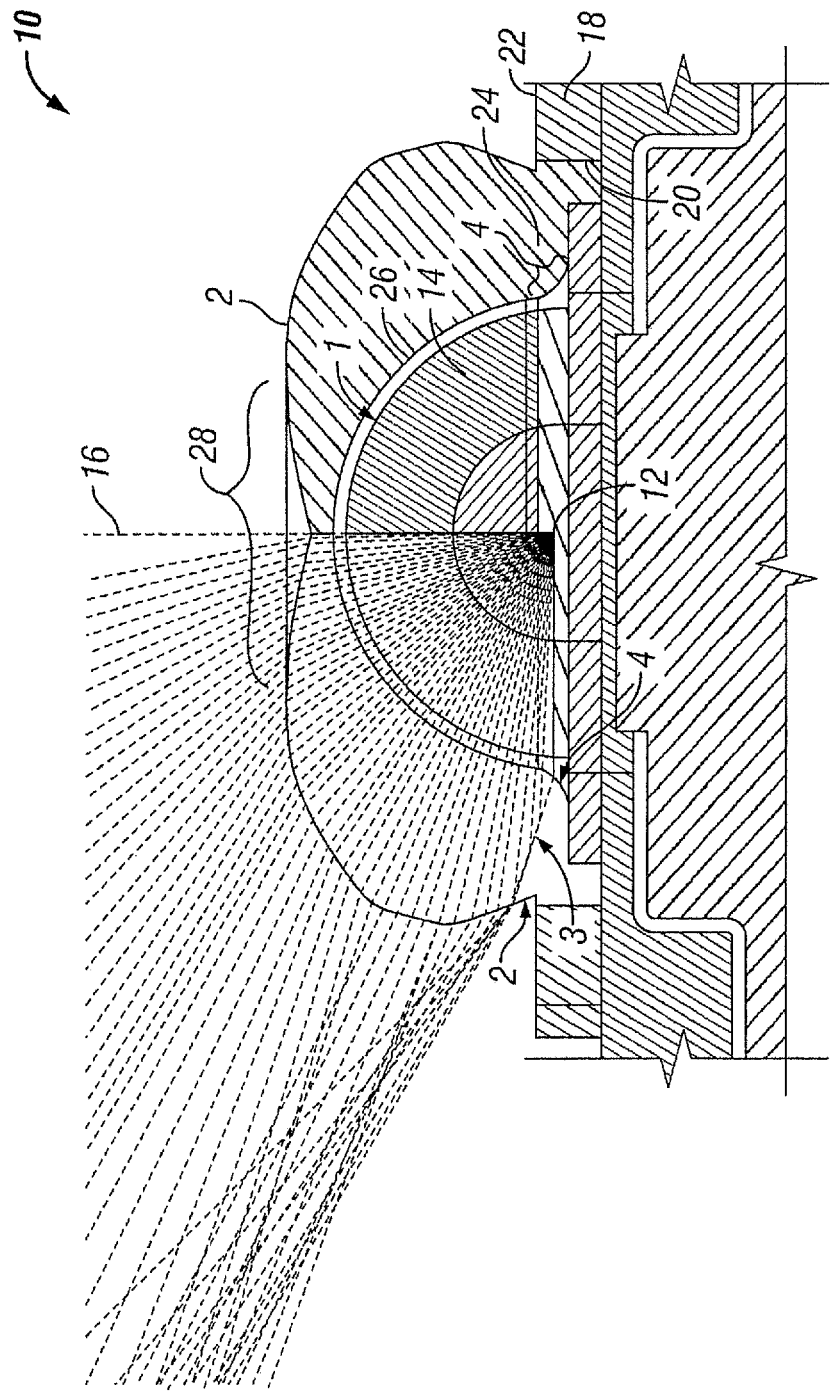

LED DEVICE FOR WIDE BEAM GENERATION AND METHOD OF MAKING THE SAME

RELATED APPLICATIONS

The present application claims priority to and is a continuation under 35 U.S.C. §120 of U.S. Non-provisional patent application Ser. No. 13/683,594 filed on Nov. 21, 2012, which claims priority under 35 U.S.C. §120 of U.S. Non-provisional patent application Ser. No. 12/599,500 filed on Nov. 9, 2009, which claims priority under 35 U.S.C. §371 to International Patent Application No. PCT/US2008/064168 filed May 19, 2008 and further claims priority under 35 U.S.C. §119 to U.S. Provisional Patent Application No. 60/939,275, filed on May 21, 2007. The entire contents of each of the above identified priority documents are hereby incorporated herein by reference. The present application is related to U.S. Non-provisional patent application Ser. No. 11/711,218, filed on Feb. 26, 2007; U.S. Provisional Patent Application No. 60/777,310, filed on Feb. 27, 2006; U.S. Provisional Patent Application No. 60/838,035, filed on Aug. 15, 2006; and U.S. Provisional Patent Application No. 60/861,789, filed on Nov. 29, 2006. The entire contents of each of the above identified related patent applications are hereby incorporated herein by reference.

BACKGROUND OF THE INVENTION

1. Field of the Invention

The invention relates to the field of apparatus and methods for using light emitting diodes (LEDs) or other light sources to generate predetermined wide profile two dimensional illumination patterns using a light source which has been optically modified to provide a corresponding wide profile beam or a flat array of multiple ones of such modified light sources.

2. Description of the Prior Art

The initial investment cost of LED illumination is expensive using cost per lumen as the metric when compared with traditional lighting means. While this may change over time, this high cost places a premium on collection and distribution efficiency of the LED optical system. The more efficient the system, the better the cost-benefit comparison with traditional illumination means, such as incandescent, fluorescent and neon.

A traditional solution for generating broad beams with LEDs is to use one or more reflectors and/or lenses to collect and then spread the LED energy to a desired beam shape and to provide an angled array of such LEDs mounted on a curved fixture. For example, street light illumination patterns conventionally are defined into five categories, Types I-V. Type I is an oblong pattern on the street with the light over the center of the oblong. Type II is a symmetric four lobed pattern with the light over the center of the lobed pattern. Type III is a flattened oblong pattern with the light near the flattened side of the oblong. Type IV is parabolic pattern with a flattened base with the light near the flattened base. Type V is a circular pattern with the light over the center of the circle. Any asymmetric aspect of these categorical patterns is obtained by mounting the light sources in a curved armature or fixture. By curving or angling the fixture to point the LEDs or light sources in the directions needed to create a broad or spread beam onto a surface, such as a street, a portion of the light is necessarily directed upward away from the street into the sky.

Hence, all airplane passengers are familiar with the view of a lighted city at night on approach. This often dazzling display is largely due to street lights and more particularly to street lights that have canted fixtures to create spread beams and hence collectively direct a substantial amount of light skyward. In an efficiently lighted city, the city would appear much darker to aircraft, because the street lights should be shining only onto the street and not into the sky. The dazzling city lights seen from aircraft and hill tops may be romantic, but represent huge energy losses, unnecessary fuel usage, and tons of unnecessary green house gas emissions from the electrical plants needed to generate the electricity for the wasted misdirected light.

Another technique is to use a collimating lens and/or reflector and a sheet optic such as manufactured by Physical Devices Corporation to spread the energy into a desired beam. A reflector has a predetermined surface loss based on the metalizing technique utilized. Lenses which are not coated with anti-reflective coatings also have surface losses associated with them. The sheet material from Physical Devices Corporation has about an 8% loss.

One example of prior art that comes close to a high efficiency system is the 'Side-emitter' device sold by Lumileds as part of their LED packaging offerings. However, the 'side-emitter' is intended to create a beam with an almost 90 degree radial pattern, not a forward beam. It has internal losses of an estimated 15% as well. Another Lumileds LED, commonly called a low dome or bat wing LED, has a lens over the LED package to redirect the light, but it is to be noted that it has no undercut surface in the lens for redirecting the light from the LED which is in the peripheral forward solid angle. Similarly, it is to be noted that the conventional 5 mm dome lens or packaging provided for LEDs lacks any undercut surface in the dome at all.

What is needed is an device that creates a wide angle beam, even the possibility of a radially asymmetric beam, that can be created with a design method that allows the designer to achieve a smooth beam profile which is not subject to the inherent disadvantages of the prior art.

BRIEF SUMMARY OF THE INVENTION

The illustrated embodiment of the invention includes a method of providing a predetermined illuminated surface pattern from a predetermined energy distribution pattern of an LED light source within an LED package having a light transmitting dome. The method includes the steps of: defining an estimated optical transfer function for a lens shape of an optic having a potentially refracting exterior and inner surface enveloping at least in part the light transmitting dome of the LED package; generating an energy distribution pattern using the estimated optical transfer function of a lens shape given the predetermined energy distribution pattern of the light source; generating a projection of the energy distribution pattern onto the illuminated surface; comparing the projection of the energy distribution pattern to the predetermined illuminated surface pattern; modifying the estimated optical transfer function of the lens shape; and repeating the foregoing steps of generating the energy distribution pattern using the estimated optical transfer function of the lens shape including the inner surface of the optic from the predetermined energy distribution pattern of the light source, generating the projection of the energy distribution pattern onto the illuminated surface, and comparing the projection of the energy distribution pattern to the predetermined illuminated surface pattern until acceptable consistency between the projection of the energy distribution pattern and the predetermined illuminated surface pattern is obtained. Then a lens is manufactured with the last obtained estimated optical transfer function including a shaped inner surface of the optic.

In the embodiment where the LED package is positioned within a well in a carrier, the step of defining an estimated optical transfer function of a lens shape of an optic includes the step of arranging and configuring the inner surface of the optic to direct light outside of the well, which light would otherwise be intercepted by the well but for its redirection.

In another embodiment the step of defining an estimated optical transfer function of a lens shape of an optic includes the step of arranging and configuring the inner surface of the optic to direct light in directions to satisfy user-defined system requirements.

While the apparatus and method has or will be described for the sake of grammatical fluidity with functional explanations, it is to be expressly understood that the claims, unless expressly formulated under 35 USC 112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 USC 112 are to be accorded full statutory equivalents under 35 USC 112. The invention can be better visualized by turning now to the following drawings wherein like elements are referenced by like numerals.

BRIEF DESCRIPTION OF THE DRAWINGS

FIG. 1 is the side cross sectional view of the illustrated embodiment.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

As a further improvement to a blob lens or optic, generally denoted by reference numeral 10 in FIG. 1, which is combined with an LED package 1 as described in the various incorporated applications referenced above, FIG. 1 is directed to still another embodiment which shows a radially symmetric blob optic 10 in side cross sectional view with a planar ray trace of an approximately Lambertian LED source 12. The dome 14 of the LED package 1 is shown as approximately hemispherical. Dome 14 is disposed into a cavity defined in optic 10. There is an air gap or at least a zone 26 of contrasting index of refraction so that inner surface 4 of optic 10 is a potentially refracting surface which is radially positioned around dome 14. It is immaterial whether one looks at zone 26 as having the defining refracting surface or inner surface 4 of optic 10 as the defining surface, since it is the discontinuity in the index of refraction at their mutual boundary the defines the refracting surface. By modifying the interior surface 4 of the blob optic 10, the ray set from the LED source 12 can be modified to accommodate user-defined system requirements, which may vary from one specific application to another.

For example, in the illustration of FIG. 1 LED source 12 and package 1 is positioned in a well 20 defined in a carrier 18, which places LED source 12 below the level of upper surface 22 of carrier 18. Blob optic 10 is also shown as mounted into well 20 and extending below the level of surface 22.

FIG. 1 shows that a ray 3 from the LED source 12, which is radiated at 90 degrees from the vertical centerline 16 of LED source 12, would miss the outer surface 2 of the blob optic 10 and be lost or unavailable for useful application of any sort, if it were not redirected by the inner surface 4. This is of course true not only for ray 3, but all rays which ordinarily would lie in a lower peripheral solid angle of the forward hemispherical radiation pattern of LED package 1, which lower peripheral solid angle is intercepted by the interior walls of well 20 up to surface 22.

To avoid loss of this energy component from the output or beam formed by LED package 1 in combination with optic 10, the inner surface 4 of optic 10 is inwardly curved along its lower periphery or skirt 24 to create a refraction zone 26 between dome 14 and the inner surface of optic 10 that flares radially outward to refract the intercepted light from LED package 1 to a portion of the exterior surface 2 of optic 10, which is above the level of surface 22. In the illustrated embodiment the flared skirt 24 of surface 4 is azimuthally symmetric with respect to LED source 12. However, it is entirely within the scope of the invention that flared outward portion 24 may have a shape with is a function of the azimuthal angle.

Additional effects are contemplated by other shape modifications to the inside surface 4. For example, not only is the intercepted light from LED package 1 selected for redirection, any portion of the radiated light from LED package 1 may be optically processed by a curved or shaped portion of inner surface 4 of optic 10 to redirect it to a selected portion of outer surface 2 of optic 10 for a user-defined system requirement as may be desired in any given application. For example, it is often the case that the light on or near axis 16 of LED package 1 is needed to be redirected to a different angle with respect to axis 16, namely out of the central beam toward the periphery or toward a selected peripheral direction. In such a case, inner surface 4 will then have an altered shape in its upper crown region 28, adjacent or proximate to axis 16 to refract the central axis light from LED package 1 into the desired direction or directions. For example, inner surface 4 may be formed such that light incident on a portion of surface 4 lying on one side of an imaginary vertical plane including axis 16 is directed to the opposite side of the imaginary vertical plane or across optic 10.

It is to be expressly understood that the illustrated example of an additional optical effect is not limiting on the scope or spirit of the invention which contemplates all possible optical effects achievable from modification of inner surface 4 alone or in combination with correlated modifications of exterior surface 2 of optic 10.

In summary, the illustrated embodiment of the invention is a method of providing a predetermined illuminated surface pattern from a predetermined energy distribution pattern of an LED light source within an LED package having a light transmitting dome. The method comprises the steps of: defining an estimated optical transfer function of a lens shape of an optic having a potentially refracting outer and inner surface enveloping at least in part the light transmitting dome of the LED package; generating an energy distribution pattern using the estimated optical transfer function of a lens shape from the predetermined energy distribution pattern of the light source; generating a projection of the energy distribution pattern onto the illuminated surface; comparing the projection of the energy distribution pattern to the predetermined illuminated surface pattern; modifying the estimated optical transfer function of the lens shape; and repeating the steps of generating the energy distribution pattern using the estimated optical transfer function of the lens shape including the inner surface of the optic from the predetermined energy distribution pattern of the light source, generating the projection of the energy distribution pattern onto the illuminated surface, and comparing the projection of the energy distribution pattern to the predetermined illuminated surface pattern until acceptable consistency between the projection of the energy distribution pattern and the predetermined illuminated surface pattern is obtained.

The method further comprising manufacturing a lens with the last obtained estimated optical transfer function including a shaped inner surface of the optic. The method of manufacturing includes all modes of construction now known or later devised. For example, once the acceptable transfer function for the optic is determined according to the steps described above, the shape of the outer and inner surfaces of the optic is completely defined. The optic is typically molded from transparent or optical plastic or polymer.

In the illustrated embodiment the repeated steps generates a projection of the energy distribution pattern onto the illuminated surface which is compliant with a predetermined street light illumination pattern or more specifically, one of the Type I-V street light illumination patterns.

In most practical embodiments a plurality of LED light sources are combined, so that the steps of defining an estimated optical transfer function, generating an energy distribution pattern, generating a projection of the energy distribution pattern, comparing the projection of the energy distribution pattern, and modifying the estimated optical transfer function of the lens shape are repeated for each of the plurality of LED light sources.

Further in most practical embodiments the plurality of LED light sources are mounted in a fixture or in a carrier which is in turn mounted in the fixture. The steps of defining an estimated optical transfer function, generating an energy distribution pattern, generating a projection of the energy distribution pattern, comparing the projection of the energy distribution pattern, and modifying the estimated optical transfer function of the lens shape are repeated for each of the plurality of LED light sources taking into account a position and orientation for each of the LED light sources in the fixture or in the carrier in the fixture.

Typically, in many mountings the LED package is positioned within a well defined in a carrier so that the step of generating the energy distribution pattern using the estimated optical transfer function of a lens shape comprises generating an energy distribution pattern in which a portion of light is directed outside of the well without impingement of light from the LED light source onto the well, which portion of light is emitted from the LED light source into at least a portion of a forward hemispherical solid angle centered on the LED light source, which portion of light would otherwise impinge on some portion of the well but for its redirection. The step of directing a portion of the light outside of the well comprises directing the portion of the light outside of the well using an inwardly flared skirt on the inner surface of the optic.

In general, the step of generating the energy distribution pattern using the estimated optical transfer function of a lens shape comprises generating an energy distribution pattern in which light is directed in a pattern to satisfy in a user-defined system requirement.

In another embodiment the step of generating the energy distribution pattern using the estimated optical transfer function of a lens shape comprises generating an energy distribution pattern in which light is directed through the outer surface of the optic toward an opposing side of the optic from where the light is refracted by the outer surface.

In addition to the disclosed methods above, the illustrated embodiment expressly includes the optic itself which is provided by these methods, or the fixture or carrier in which a plurality of such optics are included with their LED light sources.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a sub combination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. A lighting system comprising:
   a substrate;
   an optic that is disposed at the substrate and that comprises a refracting exterior surface and a refracting inner surface forming a cavity; and
   a light emitting diode source disposed at the substrate to emit light that illuminates the cavity and that includes rays traveling along the substrate at an orientation that would miss the refracting exterior surface, wherein the refracting inner surface is configured to reorient said rays for incidence on said refracting exterior surface.

2. The lighting system of claim 1, wherein the light emitting diode comprises a dome.

3. The lighting system of claim 1, wherein the refracting inner surface comprises a flared skirt.

4. The lighting system of claim 1, wherein the optic is mounted in a well.

5. The lighting system of claim 1, comprising a carrier disposed adjacent the optic.

6. The lighting system of claim 1, wherein a light emitting diode package comprises the light emitting diode source.

7. A lighting device comprising:
   a substrate;
   a light emitting diode source disposed at the substrate to emit light that comprises rays oriented adjacent and substantially parallel to the substrate; and
   an optic comprising an exterior surface and an interior surface that defines a cavity facing the light emitting diode source, wherein the interior surface is configured to redirect said rays outward with respect to the substrate.

8. The lighting device of claim 7, wherein said rays are radiated at 90 degrees from a centerline of the light emitting diode source.

9. The lighting device of claim 7, wherein the light emitting diode source comprises a vertical centerline, and
   wherein said rays are oriented at approximately 90 degrees relative to the vertical centerline.

10. The lighting device of claim 7, wherein a light emitting diode package comprises the light emitting diode source and a dome, and
    wherein the dome is disposed in the cavity.

11. The lighting device of claim 7, wherein the light emitting diode source comprises a light emitting diode package that is disposed in a well of a carrier.

12. The lighting device of claim 7, wherein the interior surface comprises a flared skirt.

13. The lighting device of claim 7, wherein the interior surface comprises a refracting surface.

14. A lighting device comprising:
    a substrate;
    a surface extending outwards from the substrate;
    an optic attached to the substrate adjacent the surface, the optic comprising an outer surface and an inner surface forming a cavity; and
    an LED source disposed at least partially in the cavity so as to produce light rays propagating along the substrate in an orientation for impingement on the surface,
    wherein the inner surface comprises a region that is operative to redirect said light rays away from the substrate to avoid said impingement on the surface.

15. The lighting device of claim 14, wherein the surface comprises an interior wall.

16. The lighting device of claim 14, wherein a well comprises the surface.

17. The lighting device of claim 14, wherein the LED source comprises a vertical centerline, and
    wherein said rays are oriented at approximately 90 degrees relative to the vertical centerline.

18. The lighting device of claim 14, wherein an LED package comprises the LED source.

19. The lighting device of claim 14, wherein the inner surface comprises a flared skirt.

20. The lighting device of claim 14, comprising a carrier disposed adjacent the optic.

\* \* \* \* \*